United States Patent [19]

Smits et al.

[11] Patent Number: 5,432,913
[45] Date of Patent: Jul. 11, 1995

[54] COMPUTER SYSTEM MODULE

[76] Inventors: Gerard D. Smits, 15280 Shannon Rd., Los Gatos, Calif. 95032; Leonardo Vainsencher, 1608 Hollenbeck Ave., Apt. 5, Sunnyvale, Calif. 94087

[21] Appl. No.: 243,440

[22] Filed: May 16, 1994

Related U.S. Application Data

[63] Continuation of Ser. No. 33,963, Mar. 19, 1993, abandoned, which is a continuation of Ser. No. 586,770, Sep. 21, 1990, abandoned.

[51] Int. Cl.⁶ .............................................. G06F 7/00
[52] U.S. Cl. ...................................... 395/275; 395/325; 395/725; 364/228.1; 364/228.3; 364/229; 364/229.2; 364/230; 364/230.2; 364/230.3; 364/232.7; 364/DIG. 1
[58] Field of Search ............... 395/275, 325, 500, 550, 395/725

[56] References Cited

U.S. PATENT DOCUMENTS

| | | | |
|---|---|---|---|
| 4,151,580 | 4/1979 | Struger et al. | 361/415 |
| 4,276,594 | 6/1981 | Morley | 395/800 |
| 4,293,924 | 10/1981 | Struger et al. | 364/900 |
| 4,413,319 | 11/1983 | Schultz et al. | 364/200 |
| 4,442,504 | 4/1984 | Dummermuth et al. | 395/725 |
| 4,510,551 | 4/1985 | Brainard, II | 361/398 |
| 4,608,631 | 8/1986 | Stiffler et al. | 395/325 |
| 4,872,091 | 10/1989 | Maniwa et al. | 361/424 |
| 4,882,702 | 11/1989 | Struger et al. | 395/275 |
| 4,942,516 | 7/1990 | Hyatt | 395/800 |
| 4,942,550 | 7/1990 | Murray | 364/900 |
| 4,994,902 | 2/1991 | Okahashi et al. | 357/80 |
| 5,003,463 | 3/1991 | Coyle et al. | 395/275 |
| 5,038,308 | 8/1991 | Le et al. | 395/275 |
| 5,038,317 | 8/1991 | Callan et al. | 395/325 |
| 5,038,320 | 8/1991 | Heath et al. | 395/275 |
| 5,045,998 | 9/1991 | Begun et al. | 395/325 |
| 5,056,060 | 10/1991 | Fitch et al. | 364/900 |
| 5,062,041 | 10/1991 | Zuk | 364/200 |
| 5,065,314 | 11/1991 | Maskovyak | 395/325 |
| 5,109,513 | 4/1992 | Otsuka | 395/275 |
| 5,127,095 | 6/1992 | Kadono | 395/425 |
| 5,133,071 | 7/1992 | Sato et al. | 395/700 |
| 5,138,702 | 8/1992 | Tada | 395/275 |
| 5,142,626 | 8/1992 | Arnold et al. | 395/275 |
| 5,155,839 | 10/1992 | Weppler | 395/500 |
| 5,155,840 | 10/1992 | Niijima | 395/550 |
| 5,280,586 | 1/1994 | Kunz et al. | 395/325 |
| 5,329,471 | 7/1994 | Swoboda et al. | 395/500 |

Primary Examiner—Allen R. MacDonald
Assistant Examiner—Tariq Hafiz
Attorney, Agent, or Firm—Hickman & Beyer

[57] ABSTRACT

A computer system module includes a central processing unit (CPU), a floating-point accelerator (FPA), a read/write buffer (RWB), cache memory, a clock generator, buffers, and reset logic. The signal composition of the module includes: Configuration Buffer Enable (CfgEn); Page Write (PgWrt); Block Match (BlkMtch); Byte Write Mask (WrMsk); and Test Enable (TestEn). The layout of the various components on a printed circuit board (PCB) minimizes transmission line effects, such as transmission line delay ($t_D$) and signal reflections, by keeping trace lengths as short as possible, and no line terminations are required. A heat sink (heat spreader) is provided for critical semiconductor devices, such as the CPU and the FPA. The heat sink includes a broad flat section and a button protruding from a surface thereof. An unpackaged device is mounted to the button, with a thermally and electrically conductive adhesive, and is inserted through a hole in the PCB. The broad flat section of the heat sink is mounted to one side of the PCB, and connections to the die are made with bond wires to a conductive layer on the other side of the PCB. The heat sink is advantageously employed for biasing the semiconductor device.

17 Claims, 8 Drawing Sheets

FIG. 3B

TABLE 1

SIGNAL DESCRIPTION

| SIGNAL NAME | TYPE | DESCRIPTION |
|---|---|---|
| MData(31:0) | I/O,Tri | Module Data Bus |
| MDataEn* | I | Module Data Bus Enable. |
| MAdr(31:2) | Tri | Module Address Bus. |
| WrMsk*(3:0)/ MAdr(1:0),MAcTy(1:0) | Tri | Byte Write Mask, during memory writes; MAdr(1:0) MAcTy(1:0), during reads. |
| MAdrEn* | I | Module Address Bus Enable. |
| MAcTy(2) | O | Buffered version of the CPU AccTyp(2) signal. |
| MCpCon(3,2,0) | I | CPU CpCond(3,2,0) signals. Clocked in by SysClk. |
| IntrRq*(4:0) | I | Interrupt Request. Clocked in by SysClk. |
| MRun* | O | Buffered version of the CPU Run* signal. |
| MExc* | O | Buffered version of the CPU Exception* signal. |
| RdReq* | O | Registered version of the CPU MemRd* signal. |
| RdBsy | I | Read Busy. Clocked in by SysClk. |
| BlkMtch | O | Block Match. |
| RdAdrEn* | I | Read Address Enable. |
| WrReq* | O | Write Request. |
| WrAck* | I | Write Acknowledge. Clocked in by SysClk. |
| PgWrt | O | Page Write. |
| BErr* | I | Bus Error. Clocked in by SysClk. |
| MRst* | I | Module reset. |
| CfgEn* | O | Configuration Buffer Enable. |
| TestEn* | I | Test Enable. |
| SysClk(2:1) | O | System Clock. |
| Clk2x | I | External 2x Clock. |

COMPUTER SYSTEM MODULE

This application is a continuation of U.S. patent application Ser. No. 08/033,963 filed Mar. 19, 1993, now abandoned, which is a continuation of U.S. patent application Ser. No. 07/586,770 filed Sep. 21, 1990, now also abandoned.

TECHNICAL FIELD OF THE INVENTION

The invention relates to computer systems and, more particularly, to modular systems.

BACKGROUND OF THE INVENTION

Computer systems include many elements such as processors, memory and input/output (I/O) devices. It is known to provide some of these elements as "modules" that plug in to a motherboard and interface with the other elements over various buses (e.g., Control, Data, Address). Examples of such modules are processor boards, video boards, memory devices, memory expansion boards, keyboards, etc.

The functionality and interface connections of a particular module varies, from architecture to architecture, and in some cases, a "newer" module with increased functionality is not "downwardly" compatible with an earlier version of the module. Hence, difficult choices must be made in the specification of a module, in light of design constraints.

A further consideration in the design of a module is the thermal characteristics thereof. As semiconductor devices become smaller and faster, the problem of heat dissipation tends to become exacerbated. Hence, packaging considerations are also paramount.

DISCLOSURE OF THE INVENTION

It is therefore an object of the present invention to provide improved manufacturing and packaging techniques for a computer system module.

It is a further object of the present invention to provide a computer system module using chip on board assembly techniques.

It is a further object of the present invention to combine microprocessors, ASICs and fast memory into a single integrated assembly.

It is a further object of the present invention to provide a standardized interface to a computer system module.

It is a further object of the present invention to provide an interface that is upwardly expandable.

It is a further object of the present invention to provide a computer system core module that is optimized for layout.

It is a further object of the present invention to provide a computer system core module that has self-contained, timing control.

It is a further object of the present invention to provide improved thermal characteristics in a computer system module.

According to the invention, a computer system core module includes a central processing unit (CPU), a floating-point accelerator (FPA), a read/write buffer (RWB), cache memory, a clock generator, buffers, and reset logic, each of which is assembled to a printed circuit board (PCB) using chip on board techniques. The CPU, FPA and RWB are preferably mounted as bare dies. The reset logic provides reset signals for the CPU, FPA and RWB in response to external (to the module) stimuli.

The signal composition of the module includes: Configuration Buffer Enable (CfgEn); Page Write (PgWrt); Block Match (BlkMtch); Byte Write Mask (RWMsk); and Test Enable (TestEn), in addition to more "standard" signals. All external signals are provided to the module via a connector, from a "motherboard" of an external system.

The layout of the various components on the printed circuit board (PCB) minimizes transmission line effects, such as transmission line delay ($t_D$) and signal reflections, by keeping trace lengths as short as possible, and no line terminations are required. Also, the RWB (110) is advantageously positioned in close proximity to the CPU and the connector.

A heat sink (heat spreader) is provided for critical semiconductor devices, such as the CPU and the FPA processor chips. The heat sink includes a broad, flat heat-dissipating section and a button protruding from a surface thereof. An unpackaged device is mounted to the button, with a thermally and electrically conductive adhesive, and is inserted through a hole in the PCB. The broad flat section of the heat sink is bonded with adhesive to one side of the PCB, and connections to the die are made with bond wires to a conductive layer on the other side of the PCB. The heat sink is advantageously employed for biasing the semiconductor device.

Other objects, features and advantages of the present invention will become evident in light of the following description thereof.

BRIEF DESCRIPTION OF THE DRAWINGS

FIG. 3B is a Table of the signals set forth in FIG. 3A.

In the description, the following terms and abbreviations are or may be used: central processing unit, or processor (CPU), Random Access Memory (RAM), Dynamic RAM (DRAM), Static RAM (SRAM), Integrated Circuit (IC), Application Specific Integrated Circuit (ASIC), Programmable Logic Device (PLD), Programmable Array Logic (PAL), Programmable Logic Array (PLA), Input/Output (I/O), kilo (k), mega (m). Further, various signals are designated by generally accepted acronyms, such as enable (EN), read (RD), write (WR), fetch (FTCH), memory (M), data (D), instruction (I), test (TEST), acknowledge (ACK), block (BLK), etc., which may be compounded to provide descriptive signal names. In some cases, signal descriptions include the nomenclature [##:#], which indicates the total signal complement of a byte-wide signal bus. In some cases, a signal name is followed by an asterisk ("*"), which indicates the negative complement of that signal.

DETAILED DESCRIPTION OF THE INVENTION

Core Module Architecture

Figure 1:
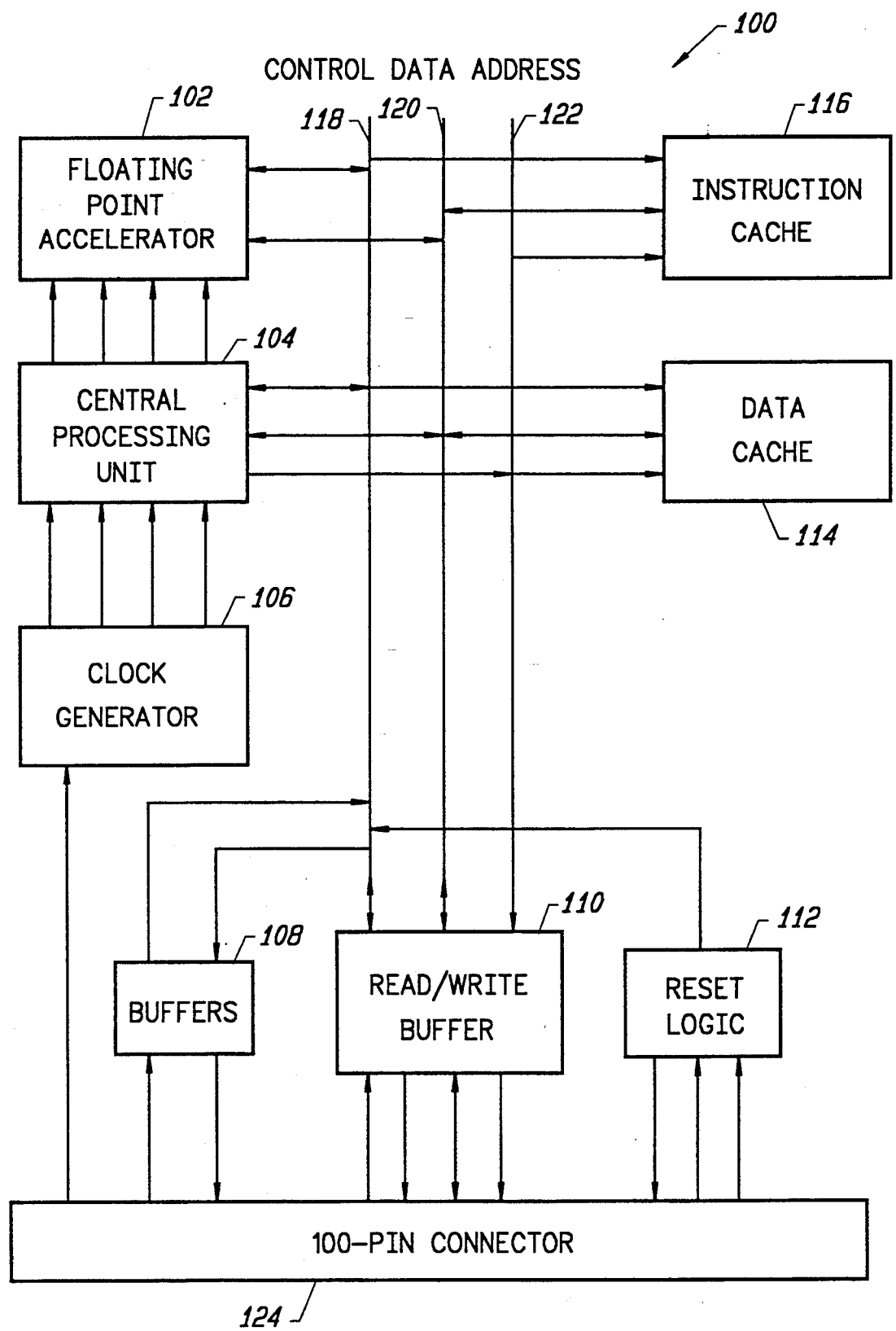
FIG. 1 is a generalized block diagram of the gross architecture of the computer system module of the present invention.

FIG. 1 shows a computer system core module 100, and the general relationship between the following major elements: A Floating-Point Accelerator (FPA) 102, a Central Processing Unit (CPU) 104, a clock generator (CLOCK GEN) 106, buffers 108, a Read-Write Buffer (RWB) 110, reset logic 112, a data cache (DCache) 114, an instruction cache (ICache) 116, a control bus (Control) 118, a data bus (Data) 120, an address bus (Address) 122 and a connector 124.

Various currently available components are suitably employed in the module 100, namely: for the CPU 104, an LR3000 High Performance RISC Processor; for the FPA 102, an LR3010 Floating-Point Accelerator; and for the RWB 110, an LR3220 Read-Write Buffer, all of which are available from LSI Logic Corporation, Milpitas, Calif. (Specification sheets for these devices are available from LSI Logic Corporation.)

Central Processing Unit 104

The LR3000 Microprocessor (CPU) is a MIPS (trademark of MIPS Computer systems Inc.) RISC (Reduced Instruction Set Computing) microprocessor, and includes on-chip memory management and support for up to three coprocessors, including the LR3010 FPA (102), cache interface and control for off-chip caches (114, 116) and main memory control logic which can be interfaced with the LR3220 RWB (110) to improve memory bandwidth. The LR3000's on-chip memory management function is fully associative, employing a 64-entry translation lookaside buffer. The on-chip cache control manages separate external instruction and data caches, of up to 356 Kbytes each, both of which can be accessed during a single CPU cycle. The LR3000 generates all the required cache and main memory control and address signals for attached coprocessors. Each AdrLo line of the CPU is connected to the SRAMs (126, FIG. 4A) of the caches 114, 116 and to the RWB 110.

Floating-Point Accelerator 102

The LR3010 Floating-Point Accelerator (FPA) provides high-speed, floating point capability for systems based on the LR3000 CPU (106). The organization of the of the FPA architecture is similar to that of the LR3000 CPU, and allows for optimization of both integer and floating-point performance. The LR3010 FPA connects "seamlessly" to the LR3000 CPU, and since both units receive instructions in parallel, floating-point instructions can be initiated at the same single cycle rate as fixed-point instructions.

Read-Write Buffer 110

The LR3220 Read-Write Buffer (RWB) is the main interface between the CPU 104 and the remainder of the computer system 100. It provides the buffering necessary for decoupling the internal address and data buses, 122 and 120. It enhances performance of MIPS architecture based systems by buffering write and read operations. Using the LR3220 RWB, systems can perform memory write operations at the cycle rate of the processor (104), instead of stalling the processor to write data to memory. On memory read operations, the system (100) uses the RWB 110 to pass the read address to main memory (not shown), and latch the read data from memory. The LR3220 RWB generates parity, and then passes the data and parity to the processor 104. A single LR3220 RWB provides six-deep write buffering and one level of read buffering for 32 bits of address and 32 bits of data. It operates at the system clock rate.

Caches 114 and 116

The instruction and data caches 116 and 114, respectively, are suitably implemented with 8K×20 SRAMs (Static RAMs) with on-board address latches, such as Motorola MCM62820-23 devices. Three devices would be required to provide a 60-bit cache word size separately for each cache. (See SRAMs 126 in FIG. 4A.) Suitable SRAMs are Motorola MCM62820 devices.

As shown, there is no additional buffering between the CPU 104 and the caches 114 and 116, and there is no hardware support for multiprocessing. However, these features could be added so that an external system would have access to invalidate and/or read the data cache.

Clock Generator 106

The clock generator 106 is a four phase device generating clock signals for the CPU, FPA and RWB, in response to an external signal (MRst).

Buffers 108

The buffer 108 buffers I/O between the external system and the CPU, FPA and RWB via the control bus 118. A suitable device is a 74ALS244 tri-state buffer.

Reset Logic 112

Figure 2A:
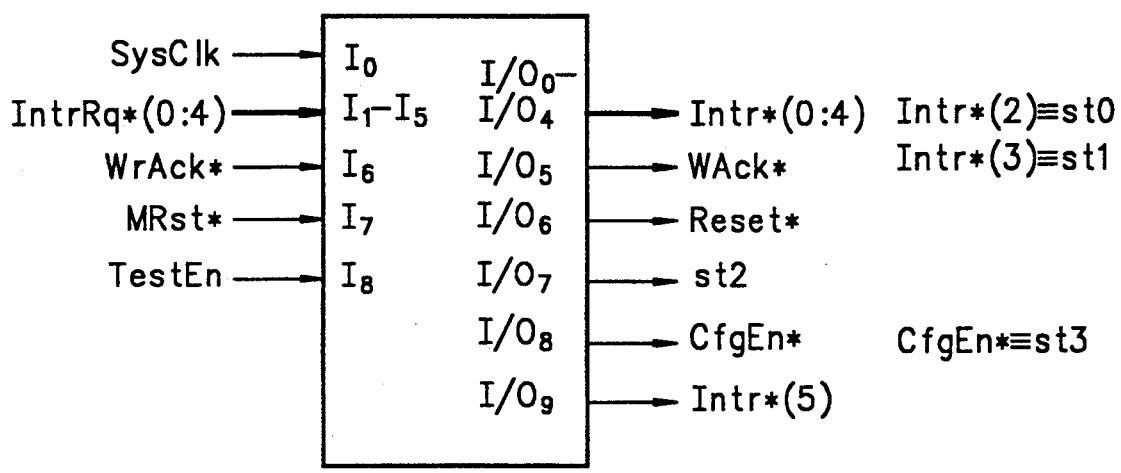
FIG. 2A is a generalized diagram of the external signal composition for reset logic (112) of the computer system module of FIG. 1.
Figure 2B:
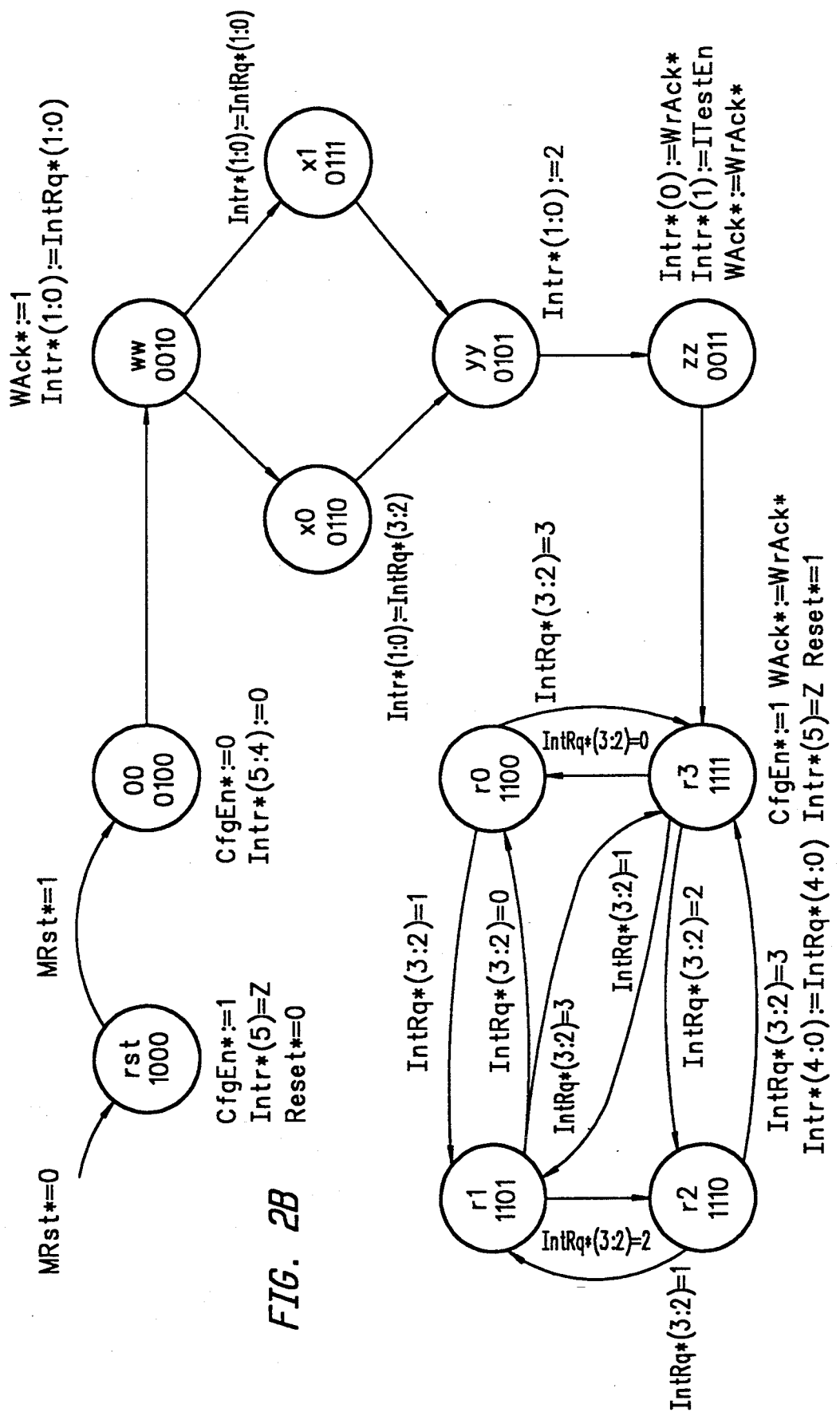
FIG. 2B is a state diagram for the reset logic of FIG. 1.

FIGS. 2A and 2B show in greater detail the reset logic 112, which performs the following functions:

a. generating an internal reset signal for the CPU 104, FPA 102 and RWB 110, in response to an external module reset signal (MRst, See Table 1, FIG. 3B), which is asynchronous;

b. sequencing CPU interrupt requests (Intr) and RWB Acknowledge (WAck) signals through various (W, X, Y, Z) configuration cycles, according to configuration information presented during reset to the interrupt request (IntRq) and read/write acknowledge (WAck) module input signals.

c. Providing a configuration enable signal (CfgEn) at the appropriate time during reset. This signal may be connected to the output enable (OE) pin of the buffer 108. Inputs to the buffer may come from configuration jumpers (not shown) on the mother board (402, FIG. 4C), and its outputs are connected directly to the IntRq and WAck module inputs (Table 1, FIG. 3B).

d. Buffering and resynchronizing the CPU Intr and RWB Acknowledge signals. This function increases timing margins, especially regarding CPU interrupt requests (Intr).

e. Configuring the module 100 for testing by setting the CPU 104 and FPA (102) in the tristate mode. This function gives the ability to use an external probe to drive the Cache (114, 116) and RWB (110) in lieu of the CPU (104).

These functions (a. through e.) are suitably implemented with a single GAL22V10-15 or P22V10-15 PAL device.

FIG. 2A shows the input and output pin assignment for the reset logic 112. FIG. 2B is a state diagram illustrating the function of the reset logic. The reset logic is described in greater detail in the appended pages 12-22 and 68-76 of "LRM301 Design Specification".

Module Interface

Figure 3A:
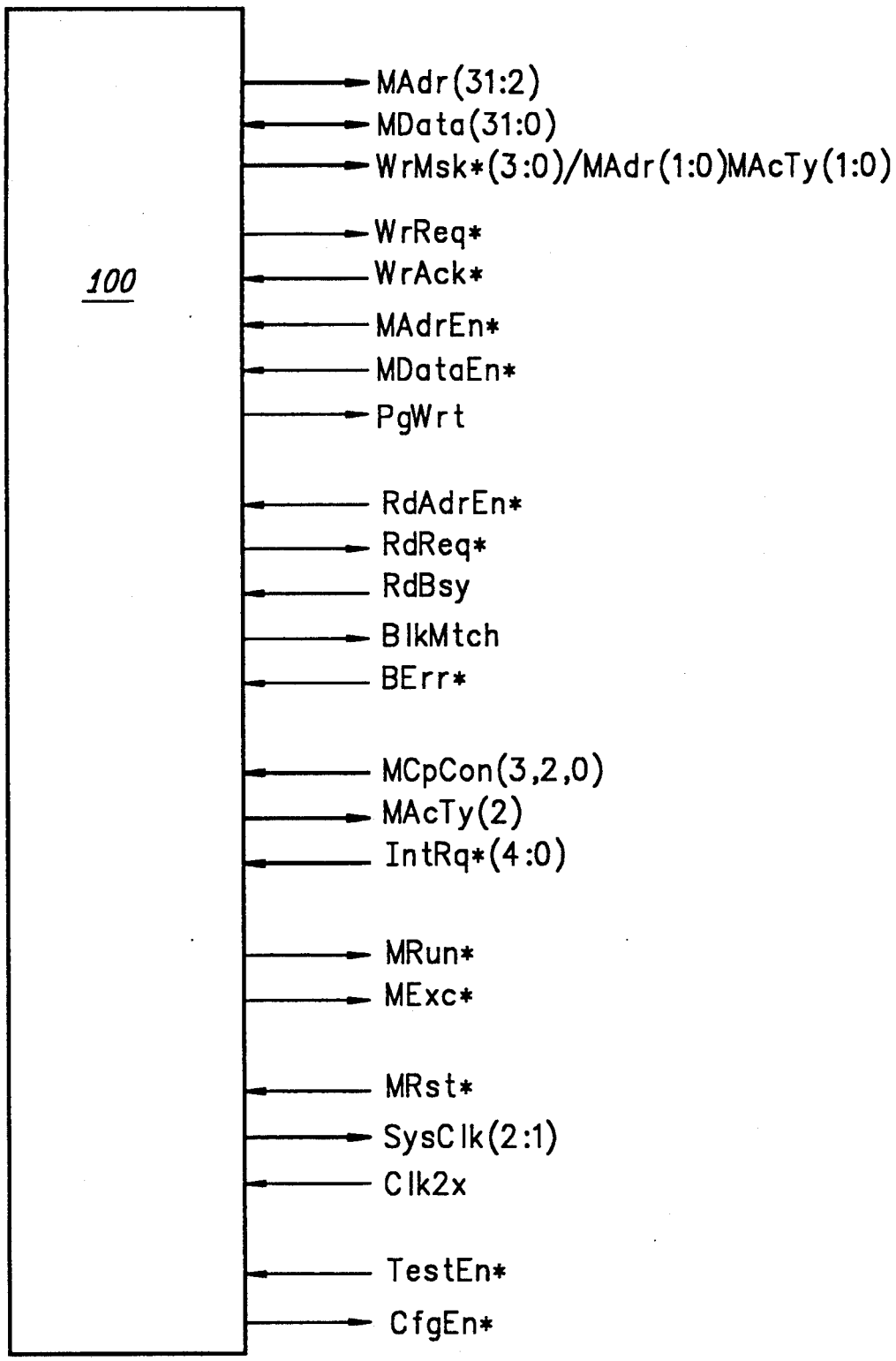
FIG. 3A is a diagram of a portion of the external signal composition of the computer system module of FIG. 1.

The computer system module 100 interfaces to an external system (not shown) with a total of 93 signals. These signals are suitable provided to the external system over a 100-pin connector (124, FIG. 4A), such as a 100-pin AMP uStrip (Trademark of AMP, Inc.). FIGS. 3A and 3B show the general composition of those signals, which are described in greater detail in the appended pages 1-11 of "LRM301 RISC CORE MODULE".

Module Assembly

Figure 4A:
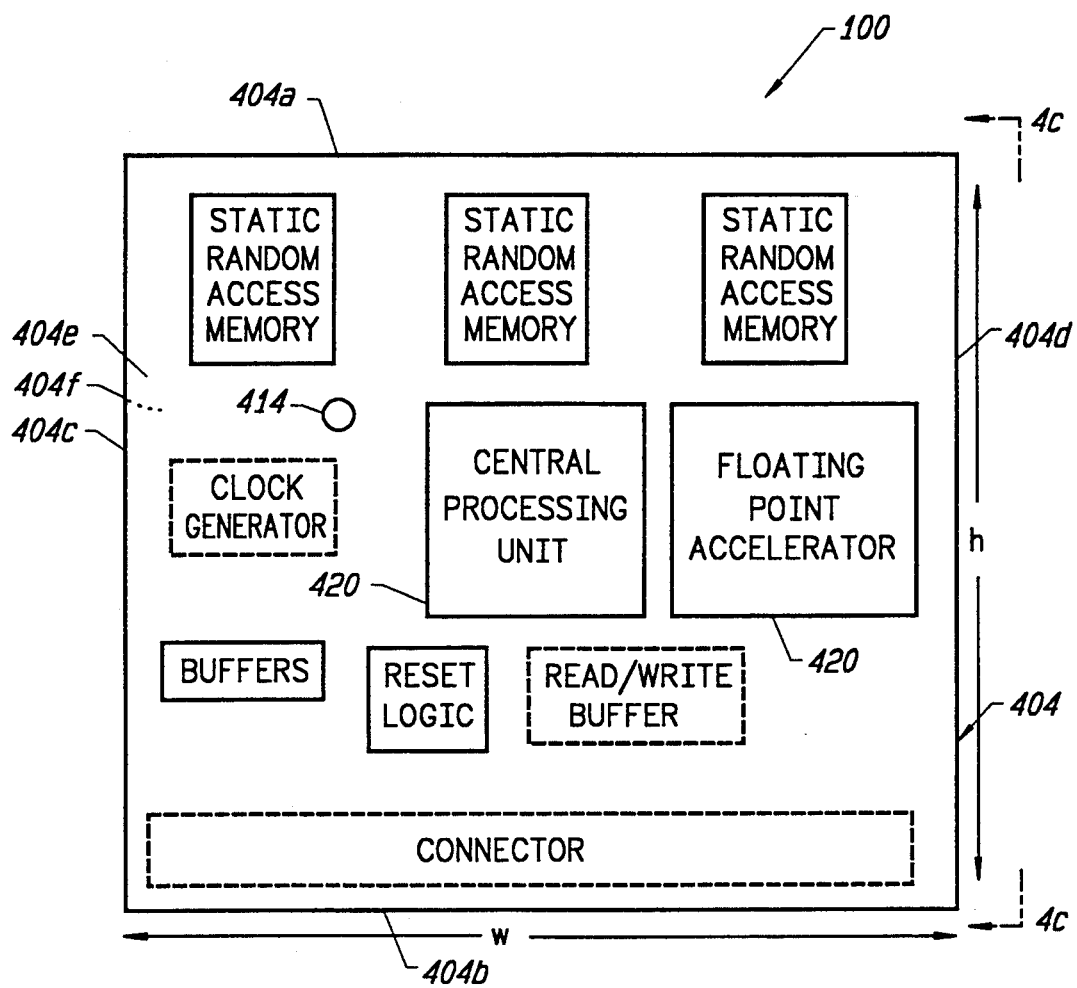
FIG. 4A is a top plan view of the physical layout of the computer system module of FIG. 1, showing the layout of exemplary components.
Figure 4C:
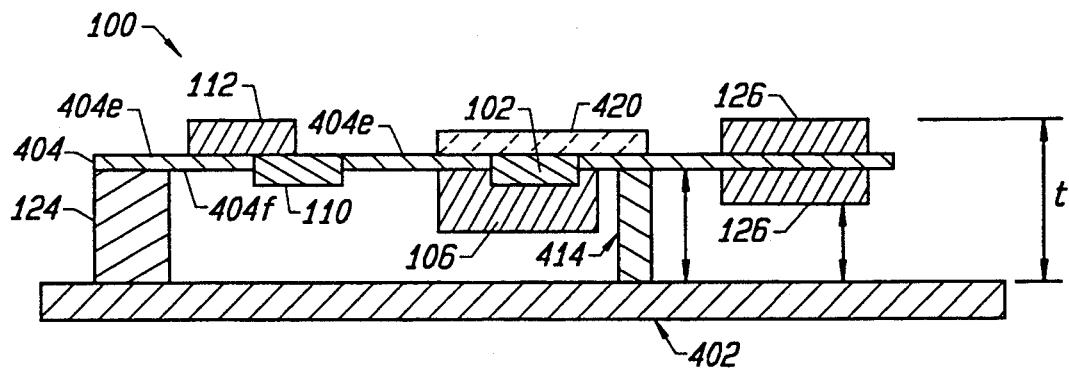
FIG. 4C is a side cross-section of the computer system module of FIG. 4A, taken on a line 4C—4C through FIG. 4A.
Figure 4D:
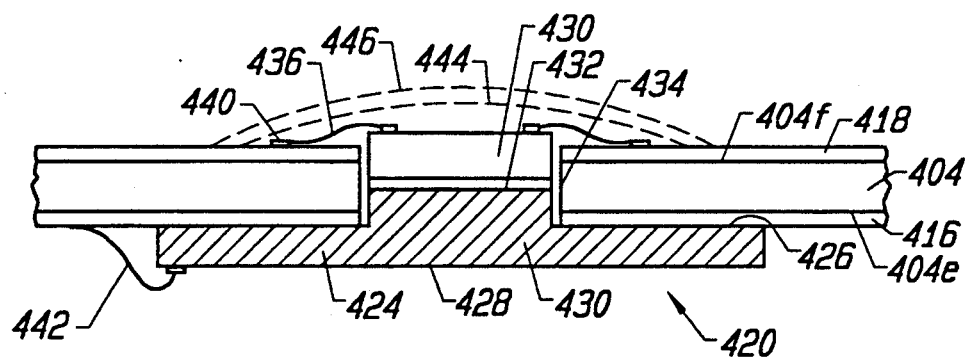
FIG. 4D is a side cross-section of a portion of the computer system module of FIG. 4C, particularly illustrating the heat sink structure of the present invention.
Figure 4B:
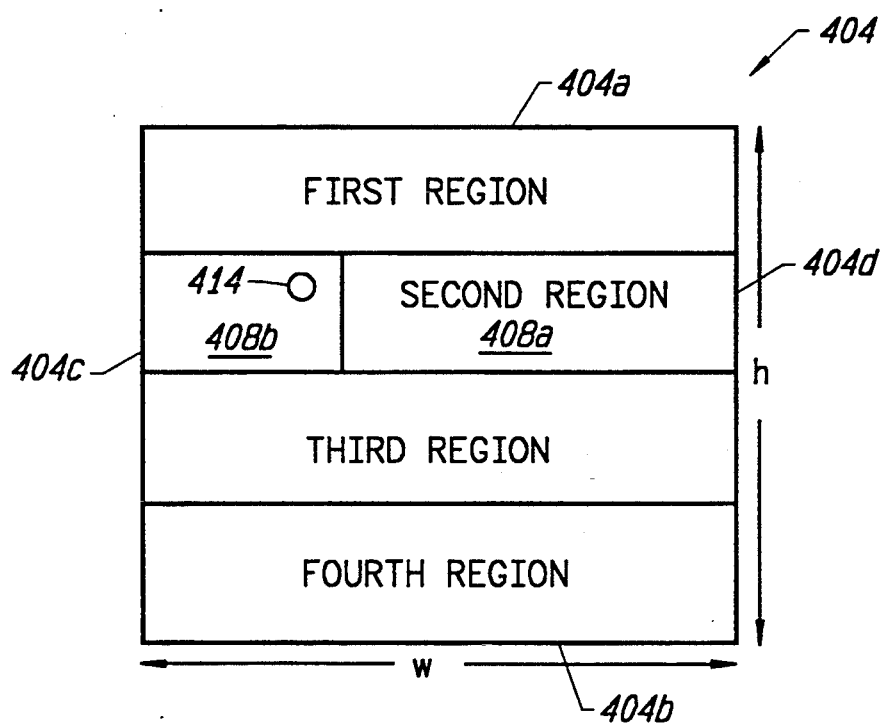
FIG. 4B is a topographical top view of the computer system module of FIG. 1, corresponding to FIG. 3A and showing a generalized functional layout of components.
Figure 5A:
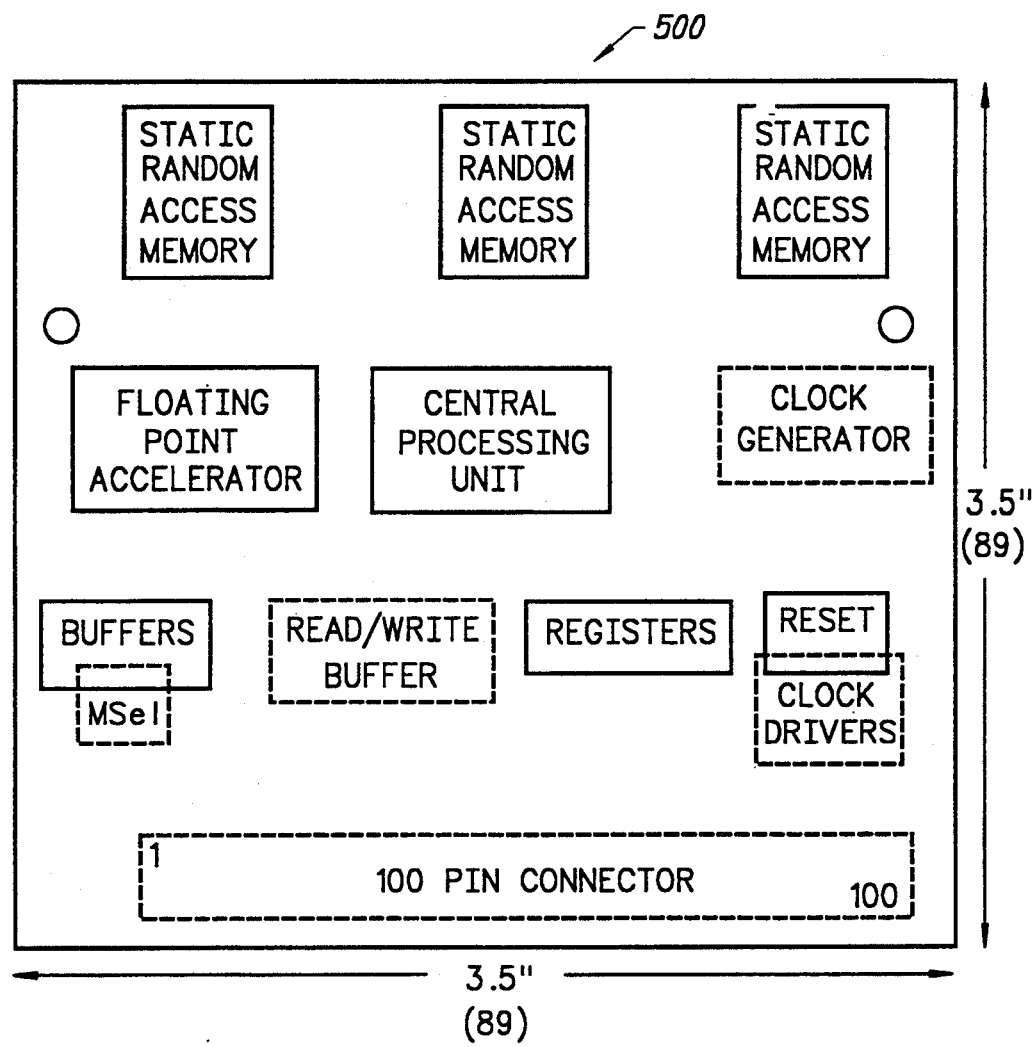
FIG. 5A is a plan view of an alternate layout of the module of FIG. 1A.
Figure 5B:
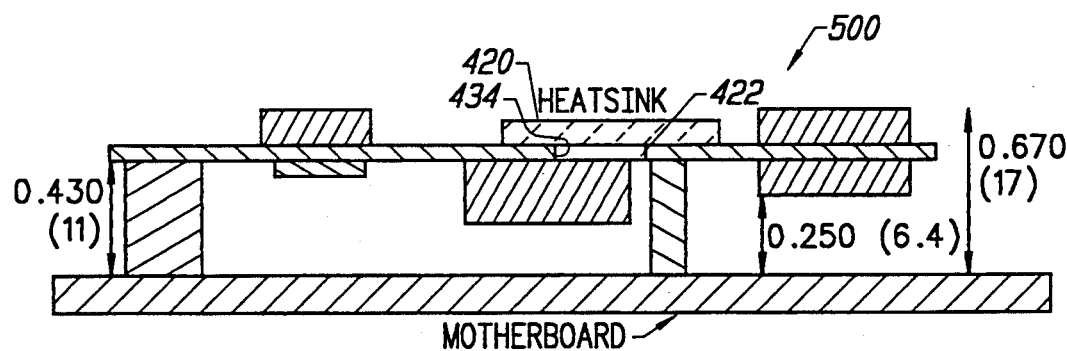
FIG. 5B is a cross-sectional view of the layout of FIG. 5A.

FIGS. 4A and 4C show the physical layout of the module 100. FIG. 4B shows the topographical layout of the components of the module, and corresponds to FIG. 4A. In FIG. 4C, the module 100 is shown mounted to a motherboard 402 of an external system such as a workstation, via the connector 124 and a standoff element 414. FIG. 4D shows a detail of the heat sink arrangement. FIGS. 5A and 5B show an alternate layout 500 for the module.

The FPA 102, CPU 104, CLOCK GEN 106, RWB 110, Reset Logic Chip 112, Cache SRAMs 114 and 116 (Six SRAMs 126 comprise the cache memory), and connector 124 components (discussed with respect to FIG. 1) are all mounted to a printed circuit board (PCB) 404. As discussed hereinafter, the processors (CPU and FPA) are mounted as bare, unpackaged dies to the board via heat sinks, and the RWB is also mounted to the board as an unpackaged die. The unpackaged dies (CPU, FPA, RWB) are bonded to wiring patterns on the PCB and are covered with two layers of epoxy: a first layer 444 of die coat material, such as thermoset epoxy, and a second layer of "glop top" epoxy 446 (see FIG. 4D).

In this example of packaging technology, the PCB 404 is generally square, measuring 3.5 inches (89 mm) in height (h) by 3.5 inches in width (w), has an "upper" edge 404a, an opposite "lower" edge 404b, two opposing side edges 404c and 404d, and two opposing faces—a front face (surface) 404e and a back (bottom) face 404f. The overall thickness (t) of the module 100 is approximately ⅝ inch (17 mm).

As best viewed in FIG. 4B, the PCB 404 is divided into topographical regions 406-412, as follows:

- A first region 406 extends from the upper edge 404a of the PCB 404 approximately one inch (25 mm), or 29% of the PCB height (h), towards the lower edge 404b thereof.
- A second region 408 extends from the first region 406 approximately one and one-quarter inches (32 mm), or 36% of the PCB height (h), towards the lower edge 404b thereof.
- A third region 410 extends from the second region 408 approximately three-quarters of an inch (19 mm), or 21% of the PCB height (h), towards the lower edge 404b thereof.
- A fourth region 412 extends approximately one-half inch (13 mm), or 14% of the PCB height (h), to the bottom edge thereof.

Further, the second region 408 is subdivided into two sub-regions—a larger sub-region 408a, comprising about 70% of the region 408 and extending from one side edge of the PCB 404 towards the other side edge thereof, and a smaller sub-region 408b comprising the remaining approximately 30% of the region 408.

Both faces of the PCB are used to mount components, in an efficient layout. To the extent possible, components are mounted one opposite the other (see e.g., the mounting of the SRAMs 126).

In general terms, the first region 406 comprises about 25-35% of the PCB "floorplan", the second region 408 comprises about 30-40% of the PCB floorplan, the larger sub-region 408a comprises about 60-80% of the second region 408, the smaller sub-region 408b comprises about 30-40% of the second region 408, the third region 410 comprises about 15-25% of the PCB floorplan, and the fourth region 412 comprises about 10-20% of the PCB floorplan.

Functionally, memory (particularly cache memory 114 and 116) is disposed in the first region 406, processing (CPU 104 and FPA 102) is disposed in the second region 408, and additional control logic (clock drivers 108, reset logic 112, RWB 110) is disposed in the third region 410, and the external connections (connector 124) are made in the fourth region 412. (A portion of control logic, namely the clock generator 106, is disposed in the smaller sub-region 408b.)

Components are distributed on the two faces 404e and 404f of the PCB 404, and are connected thereto via corresponding conductive wiring layers 416, 418 (see FIG. 4D) on either face of the board. The board itself is made of FR4 or BT epoxy, both of which are standard board substrate compositions.

A portion of memory (e.g., three of the six SRAMs 126 comprising cache memory 114 and 116) and a portion of the "peripheral" devices (e.g., buffers 108, and reset logic 112) are disposed on the front face 404e of the board 404. Heat sinks 420 (discussed hereinafter) are also disposed on the front face 404e.

Processing components (e.g., CPU 104 and FPA 102), the RWB 110, the connector 124, the remaining portion of the peripheral devices (e.g., clock generator 106) and the remaining SRAMs 126 are disposed on the opposite, back surface 404f of the PCB. Notably, components are not mounted opposite the processors (CPU, FPA), but SRAMs are mounted on opposing faces of the PCB.

The layout of components (module topography) described above advantageously utilizes a large portion of the surface area of both sides of the board, and minimizes trace (transmission line) lengths, and provides for thermal efficiency.

Transmission line effects are minimized by keeping trace lengths as short as possible. A rule of thumb is that if the signal transmission time (rise/fail time) is more than four times greater than the transmission line delay ($t_D$), transmission line effects may be neglected. More particularly, for a PCB with a continuous ground plane and a signal trace on the adjacent layer:

$$t_D = 1.017 \times \sqrt{0.475 \times \epsilon_r + 0.67} \left(\frac{ns}{ft}\right)$$

For PCBs made of FR4, $E_r$ is approximately 4.8, so $t_D$=1.75 ns/ft=0.15 ns/in=0.006 mm. This suggests that if a signal runs along a 4 inch (100 mm) " trace, its transition time should be greater than 2.4 nanoseconds (ns). BT epoxy, with a dielectric constant between 4.0 and 4.5@1 MHz, is also a suitable choice for the PCB material.

The physical location of the RWB 110 on the module is chosen to provide the shortest possible connection path to the connector 124 and to the CPU 104. In the physical example discussed herein, most of the traces converging at the RWB 110 are shorter than two inches (50 mm), or less than 60% of the longest board side dimension (h or w).

Heat Dissipation

Heat is inevitably generated during operation of a semiconductor device, and may become destructive of the device if left unabated. Therefore, it is generally well known to provide some sort of heat sink for such devices. Generally, heat sinks take one of two forms. They may be integral with the device package or they may be external to the device package. In either case, heat sinks generally include a thermal mass in intimate heat conductive relationship to the semiconductor device, and may involve air convection or forced air cooling of the thermal mass.

As shown in FIGS. 4A and 4C, two heat sinks (heat spreaders) 420 are disposed on the front surface 404e of the PCB 404. As shown in FIG. 4C, when the module 100 is mated to the motherboard 402, the front surface 404e of the PCB is the "external" surface thereof, for receiving a flow of cooling air.

Each heat sink 420 advantageously dissipates heat generated by the processing components (e.g., CPU 104 and FPA 102), when operating. According to an aspect of the present invention, the heat sink 420 also provides for biasing of the (processor) chips being cooled thereby.

As best viewed in FIG. 4D, each heat sink 420 is generally a flat, thin plate (424) of thermally conductive material, such as copper, or copper/tungsten alloy. Copper is a preferred choice for its heat spreading characteristics, while tungsten gives advantageous thermal expansion performance. Alternatively, the heat sink can be formed of aluminum or a ceramic material, such as Beryllium Oxide or Aluminum Nitrate. Preferably, the heat sink is electrically conductive, as discussed hereinbelow.

In the context of the example of module dimensions set forth above, each heat sink 420 measures approximately 1 inch (25 mm) wide by 1 inch high by one-eighth inch (3 mm) thick, and is substantially larger in area than the semiconductor device being cooled, such as six to eight times larger. For a copper heat sink, the thickness of the section 424 is on the order of one millimeter. For a copper/tungsten heat sink, the thickness is on the order of three millimeters. A preferred copper/tungsten alloy contains approximately 15% tungsten.

FIG. 4D shows one heat sink 420 and corresponding semiconductor device 422 (e.g., CPU 104). As used herein, the term "semiconductor device" means a bare, unpackaged semiconductor chip.

The heat sink 404 comprises a flat, broad, heat dissipating section 424, having an "inner" surface 426 and an "outer" surface 428. The heat sink 420 further comprises a smaller, central "button" 430, preferably integrally formed with the broad section 424, and extending from the inner surface 426 thereof a distance approximately equal to the thickness (t) of the PCB 404 (including cladding 416 and 418). The button 430 should not stand taller than the thickness (t) of the PCB 404, and may be up to 0.01 inch (0.25 mm) shorter. The button 430 is square and is approximately the same size as the die of the semiconductor device 422 (e.g., ⅜ inch or 10 mm).

As shown in FIG. 5B, the die 422 may reside nearly entirely within the through hole 434.

The inner surface of the heat sink is adhered to one side of the PCB with a suitable adhesive (not shown). The adhesive need not be electrically conductive, as the heat sink is wired to the PCB, as discussed hereinbelow.

The non-circuit side of the semiconductor device (die) 422 is mounted to the button 430 by a dollop of thermally and electrically conductive epoxy 432. Silver-based epoxy compounds are suitable for this application, in that they are thermally and electrically conductive, and are able, when applied with sufficient thickness, to alleviate stresses due to the different thermal expansion properties of the heat sinks, board and dies.

The electrical conductivity of the epoxy 432 allows for biasing the die. For a typical die, which is n+, this allows a +5 volt bias to be applied to the die via the heat spreader. Even though unnecessary for operating the chip, this bias improves noise immunity. This biasing requirement argues for the use of copper for the heat sink.

The PCB 404 is provided with a through hole 434 slightly larger than either the button 430 or the semiconductor device 422 so that the assembled heat sink 420 and device 422 may be mounted to the front side 404e of the PCB 404 by inserting the device 422 and button 430 through the through hole 434. The inner surface 426 of the heat sink is then fixed to the lower wiring layer 416 of the PCB, such as with a suitable adhesive.

Bond wires 436 are shown connecting bond pads 438 of the chip to trace pads 440 on the wiring layer 418 of the PCB 404. Many such connections would typically be made to corresponding pads on the semiconductor device. Additionally, a bond wire 442 connects the heat spreader to the wiring layer for applying the aforementioned +5 v bias to the die.

As best viewed in FIG. 4A, the overall dimensions on the heat sink 420 are approximately one inch (25 mm) square, covering approximately seven (six to eight) times the area of the chip being cooled (e.g., CPU 104 or FPA 102).

Alternatively, the two heatsinks 420 can be combined into a single, rectangular heat sink having two buttons 430 (one for each chip). With a single heatsink mounting the two processor components (CPU and FPA), there is an averaging effect which benefits from the fact that the two processing components usually operate at different times.

Summary of Advantages

Combining processors, ASICs and fast memory in a single integrated assembly provides a feasible approach to high volume, cost sensitive application.

The multichip module of this invention allows for packaging and partitioning at the chip level, internalizes critical timing, minimizes inductance and capacitance, and maximizes thermal flow.

APENDICES

Appended hereto as part of the disclosure are:
1. *LRM RISC CORE MODULE* (Advanced Information), Apr. 18, 1990, pp. 1–11, LSI Logic Corporation, Milpitas, Calif.
2. *LRM301 Design Specification* (Preliminary), Mar. 15, 1990, pp. 12–22, 68–76, LSI Logic Corporation, Milpitas, Calif.
3. *LR3000 High Performance RISC Microprocessor* (Preliminary), September 1988, LSI Logic Corporation, Milpitas, Calif.
4. *LR3010 Floating-Point Accelerator* (Preliminary), September 1988, LSI Logic Corporation, Milpitas, Calif.
5. *LR3220 Read-Write Buffer* (Preliminary), October 1989, LSI Logic Corporation, Milpitas, Calif.

What is claimed is:

1. A Computer System core module comprising:
   a single printed circuit board;
   at least one processor mounted on the printed circuit board;
   a read-write buffer mounted on the printed circuit board and connected to the at least one processor;
   memory devices mounted on the printed circuit board and connected to the read-write buffer;
   clock means for generating clock signals and for conveying the clock signals to the at least one processor, the clock means mounted on the printed circuit board;
   receiving means for receiving an asynchronous reset signal onto the printed circuit board, the receiving means mounted on the printed circuit board, said asynchronous reset signal being generated external to the printed circuit board;
   reset logic system means mounted on the printed circuit board for generating synchronous reset signals and for conveying the synchronous reset signals to the at least one processor and to the read-write buffer in response to the asynchronous reset signal; and
   a connector on the printed circuit board for plugging the printed circuit board into a receptacle on a motherboard of an external system, for conveying signals from the printed circuit board to the motherboard, and for conveying signals from the motherboard to the printed circuit board, including conveying an externally-provided asynchronous reset signal from the motherboard to the reset logic system on the printed circuit board.

2. A computer system core module according to claim 1, wherein:
   one of the at least one processors is a co-processor.

3. A computer system core module according to claim 1, wherein:
   the external system is a workstation.

4. A computer system core module according to claim 1, wherein:
   at least one of the at least one processors generates interrupt request signals for the reset logic system;
   the read-write buffer generates acknowledge signals for the reset logic system;
   the reset logic system synchronizes the interrupt request signals and the acknowledge signals in response to a configuration signal received on the printed circuit board from the external system.

5. A computer system core module according to claim 4, wherein:
   the reset logic system buffers and resynchronizes the interrupt request signals and the acknowledge signals to control timing margins between the interrupt request signals and the acknowledge signals.

6. A computer system core module according to claim 1, wherein:
   the reset logic system generates a configuration enable signal configuring states of the various elements on the printed circuit board in conjunction with generating the reset signals for the at least one processor and the read-write buffer.

7. A computer system core module according to claim 1, wherein:
   the reset logic system generates a signal for setting the at least one processor in a tristate mode, thereby allowing an off-board probe to drive the read-write buffer.

8. A computer system core module according to claim 1, wherein:
   the read-write buffer is disposed at a location on the printed circuit board wherein said read-write buffer has the shortest possible connection path to the connector and to the at least one processor.

9. A computer system core module comprising:
   a single printed circuit board;
   at least one processor mounted on the printed circuit board;
   a read-write buffer mounted on the printed circuit board and connected to the at least one processor;
   memory devices mounted on the printed circuit board and connected to the read-write buffer;
   clock means or generating clock signals and for conveying the clock signals to the at least one processor, the clock means mounted on the printed circuit board;
   receiving means for receiving an asynchronous reset signal onto the printed circuit board, the receiving means mounted on the printed circuit board, said asynchronous reset signal being generated external to the printed circuit board;
   reset logic system means mounted on the printed circuit board for generating synchronous reset signals and for conveying the synchronous reset signals to the at least one processor and to the read-write buffer in response to the asynchronous reset signal; and
   a connector on the printed circuit board for plugging the printed circuit board into a receptacle on a motherboard of an external system, for conveying signals from the printed circuit board to the motherboard, and for conveying signals from the motherboard to the printed circuit board, including conveying an externally-provided asynchronous reset signal from the motherboard to the reset logic system on the printed circuit board, wherein:
   the signal composition of the module includes:
   a configuration buffer enable signal (CfgEn);
   a page write signal (PgWrt);
   a block match signal (BlkMtch);
   a write mask signal (WrMsk); and
   a test enable signal (TestEn).

10. A Computer System core module comprising:
    a single printed circuit board;
    two processors on the printed circuit board;

a read-write buffer on the printed circuit board and connected to the two processors;

memory devices on the printed circuit board and connected to the read-write buffer;

clock means on the printed circuit board for generating clock signals and for conveying the clock signals to the two processors;

means for receiving, from off the printed circuit board, an asynchronous reset signal;

a connector on the printed circuit board for plugging the printed circuit board into a receptacle on a motherboard of an external system, for conveying signals from the printed circuit board to the motherboard, and for conveying signals from the motherboard to the printed circuit board, including conveying an externally-provided asynchronous reset signal from the motherboard to the reset logic system on the printed circuit board; and reset logic system means mounted on the printed circuit board for generating synchronous reset signals for synchronously resetting the two processors and the read-write buffer in response to the asynchronous reset signal; wherein:

at least one of the two processors generates interrupt request signals to the reset logic system;

the read-write buffer generates acknowledge signals to the reset logic system;

the reset logic system synchronizes the interrupt request signals and the acknowledge signals;

the reset logic system buffers and resynchronizes the interrupt request signals and the acknowledge signals to control timing margins between the interrupt request signals and the acknowledge signals;

the reset logic system generates a configuration enable signal configuring states of the various elements on the printed circuit board in conjunction with generating the synchronous reset signals; and the reset logic system generates a signal to set the two processors in a tristate mode in response to signals generated by a system located off of the printed circuit board, thereby allowing a probe external to the printed circuit board to drive the read-write buffer.

11. A computer system core module according to claim 10, wherein:
one of the at least one processors is a co-processor.

12. A computer system core module according to claim 10, wherein:
the external system is a workstation.

13. A computer system core module according to claim 10, wherein: the physical location of the read-write buffer is chosen to provide the shortest possible connection path to the connector and to the at least one processor.

14. A computer system core module comprising:
a single printed circuit board;
two processors on the printed circuit board;
a read-write buffer on the printed circuit board and connected to the two processors;
memory devices on the printed circuit board and connected to the read-write buffer;
clock means on the printed circuit board for generating clock signals and for conveying the clock signals to the two processors;
means for receiving, from off the printed circuit board, an asynchronous reset signal;
a connector on the printed circuit board for plugging the printed circuit board into a receptacle on a motherboard of an external system, for conveying signals from the printed circuit board to the motherboard, and for conveying signals from the motherboard to the printed circuit board, including conveying an externally-provided asynchronous reset signal from the motherboard to the reset logic system on the printed circuit board; and reset logic system means on the printed circuit board for generating synchronous reset signals for synchronously resetting the two processors and the read-write buffer in response to the asynchronous reset signal; wherein:

at least one of the two processors generates interrupt request signals to the reset logic system;

the read-write buffer generates acknowledge signals to the reset logic system;

the reset logic system synchronizes the interrupt request signals and the acknowledge signals;

the reset logic system buffers and resynchronizes the interrupt request signals and the acknowledge signals to control timing margins between the interrupt request signals and the acknowledge signals;

the reset logic system generates a configuration enable signal configuring states of the various elements on the printed circuit board in conjunction with generating the synchronous reset signals; and the reset logic system generates a signal to set the two processors in a tristate mode in response to signals generated by an off-board system, thereby allowing a probe external to the printed circuit board to drive the read-write buffer, wherein:

the signal composition of the module includes:
a configuration buffer enable signal (CfgEn);
a page write signal (PgWrt);
a block match signal (BlkMtch);
a write mask signal (WrMsk); and
a test enable signal (TestEn).

15. A computer system module to be plugged into a motherboard, the computer system module comprising:
a single printed circuit board;
a control bus mounted on the single printed circuit board;
a data bus mounted on the single printed circuit board;
an address bus mounted on the single printed circuit board;
a central processing unit mounted on the single printed circuit board, capable of reduced instruction set computing, and having a cache interface and a cache control system, wherein the central processing unit is in electrical communication with the control bus, the data bus, and the address bus;
a floating-point accelerator mounted on the single printed circuit board and in electrical communication with the control bus and the data bus to permit high-speed floating point capability of the central processing unit;
a read-write buffer mounted on the single printed circuit board and electrically coupled to the control bus, the data bus, and the address bus for buffering read and write operations which utilize the data bus and the address bus;
a data cache mounted on the single printed circuit board and in electrical communication with the cache interface of the central processing unit through the control bus, the data bus, and the address bus such that electrical data cache signals are transmitted between the central processing unit and the data cache under the control, at least in part, of the cache control system of the central processing unit;

an instruction cache mounted on the single printed circuit board and in electrical communication with the cache interface of the central processing unit through the control bus, the data bus, and the address bus such that electrical instruction cache signals are transmitted between the central processing unit and the instruction cache under the control, at least in part, of the cache control system of the central processing unit;

a clock generator mounted on the single printed circuit board and in electrical communication with the central processing unit for generating clock signals for the central processing unit, the floating point accelerator, and the read-write buffer in response to an external signal received from the motherboard;

memory buffers mounted on the single printed circuit board for buffering a plurality of electrical signals transferred between the motherboard and at least one of the central processing unit, the floating point accelerator, and the read-write buffer through the control bus by buffering the plurality of electrical signals transferred between the motherboard and the control bus;

a reset logic system mounted on the single printed circuit board for generating a synchronous internal reset signal for the central processing unit, the floating point accelerator, and the read-write buffer in response to the an external asynchronous reset signal received by the computer system module from the motherboard; and a connector mounted on the single printed circuit board for permitting electrical connections between the computer system module and the motherboard and for plugging the computer system module into the motherboard thereby electrically coupling the motherboard to the control bus, the data bus, the address bus, the central processing unit, the floating point accelerator, the read-write buffer, the data cache, the instruction cache, the clock generator, the memory buffers, and the reset logic system.

16. A computer system module as recited in claim 15 wherein the reset logic system sequences central processing unit interrupt requests and read-write acknowledge signals through configuration cycles in response to configuration signals received by the computer system module from the motherboard during a reset.

17. A computer system module as recited in claim 15 wherein the reset logic system configures the computer system module for testing by setting the central processing unit and the floating point accelerator into a tristate mode thereby to permit an external probe, not part of the computer system module, to drive the data cache, the instruction cache, and the read-write buffer in lieu of the central processing unit.

* * * * *